(12) United States Patent
Kubota et al.

(10) Patent No.: US 9,209,781 B2
(45) Date of Patent: Dec. 8, 2015

(54) OSCILLATOR DEVICE AND METHOD OF MOUNTING OSCILLATOR DEVICE

(71) Applicant: FUJITSU LIMITED, Kawasaki-shi, Kanagawa (JP)

(72) Inventors: Hajime Kubota, Kawasaki (JP); Masayuki Itoh, Kawasaki (JP); Masakazu Kishi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/261,639

(22) Filed: Apr. 25, 2014

(65) Prior Publication Data

US 2014/0340163 A1 Nov. 20, 2014

(30) Foreign Application Priority Data

May 20, 2013 (JP) .................. 2013-106291

(51) Int. Cl.
*H01L 41/047* (2006.01)
*H01L 41/053* (2006.01)
*H01L 41/083* (2006.01)
(Continued)

(52) U.S. Cl.
CPC ............... *H03H 9/19* (2013.01); *H01L 41/047* (2013.01); *H01L 41/053* (2013.01); *H01L 41/083* (2013.01); *H01L 41/23* (2013.01); *H01L 41/25* (2013.01); *H01L 41/27* (2013.01); *H01L 41/293* (2013.01); *H01L 41/31* (2013.01); *H03B 5/32* (2013.01); *H03H 9/0538* (2013.01);
(Continued)

(58) Field of Classification Search
CPC ... H01L 41/047; H01L 41/053; H01L 41/083; H01L 41/23; H01L 41/25; H01L 41/27; H01L 41/29; H01L 41/293; H01L 41/31; H03B 5/30; H03B 5/32; H03H 9/05; H03H 9/0519; H03H 9/0538; H03H 9/0547; H03H 9/0561; H03H 9/10; H03H 9/1021; H03H 9/1035; H03H 9/17; H03H 9/172; H03H 9/19; H03H 9/21; H03H 9/215; H03H 9/2405; H03H 9/2447; H03H 9/2468
USPC .............. 310/311, 344, 348, 368; 331/68, 69, 331/154, 156, 158
See application file for complete search history.

(56) References Cited

U.S. PATENT DOCUMENTS 6,046,529 A * 4/2000 Yoshida et al. ............... 310/348
7,936,114 B2 * 5/2011 Numata et al. ............... 310/348
(Continued)

FOREIGN PATENT DOCUMENTS

| JP | 62-291950 A | 12/1987 |
| JP | 09-213455 A | 8/1997 |
| JP | 11-176505 A | 7/1999 |
| JP | 2003-043065 A | 2/2003 |

*Primary Examiner* — Levi Gannon
(74) *Attorney, Agent, or Firm* — Squire Patton Boggs (US) LLP

(57) ABSTRACT

A oscillator device includes: a first substrate that has a first surface, a second surface, and a through hole extending between the first surface and the second surface; a crystal oscillator that is disposed on the first surface of the first substrate, the crystal oscillator including an electrode; a second substrate that is disposed on the crystal oscillator; a through electrode that is disposed in the through hole, that has a diameter smaller than a diameter of the through hole, that is electrically coupled to the electrode, and that extends between the first surface and the second surface; and a filling member with which an area between an inner wall of the through hole and the through electrode is filled.

5 Claims, 11 Drawing Sheets

(51) Int. Cl.
*H01L 41/23* (2013.01)
*H01L 41/25* (2013.01)
*H01L 41/27* (2013.01)
*H01L 41/293* (2013.01)
*H01L 41/31* (2013.01)
*H03B 5/32* (2006.01)
*H03H 9/05* (2006.01)
*H03H 9/10* (2006.01)
*H03H 9/19* (2006.01)
*H03H 3/02* (2006.01)

(52) U.S. Cl.
CPC ............... *H03H9/0561* (2013.01); *H03H 9/10* (2013.01); *H03H 9/1092* (2013.01); *H03H 3/02* (2013.01)

(56) References Cited

U.S. PATENT DOCUMENTS

| | | | |
|---|---|---|---|
| 8,129,888 B2* | 3/2012 | Kohda et al. | 310/344 |
| 8,217,736 B2* | 7/2012 | Kawashima | 333/187 |
| 8,227,958 B2* | 7/2012 | Inoue et al. | 310/344 |
| 2003/0161122 A1* | 8/2003 | Kotani et al. | 361/761 |
| 2010/0117489 A1* | 5/2010 | Takahashi | 310/344 |
| 2010/0123522 A1* | 5/2010 | Kasahara | 331/69 |
| 2010/0201221 A1* | 8/2010 | Inoue et al. | 310/312 |
| 2010/0289589 A1* | 11/2010 | Ito et al. | 331/70 |
| 2011/0050045 A1* | 3/2011 | Aratake et al. | 310/344 |
| 2011/0163637 A1* | 7/2011 | Hashi | 310/344 |
| 2011/0309720 A1* | 12/2011 | Kawahara | 310/313 R |

* cited by examiner

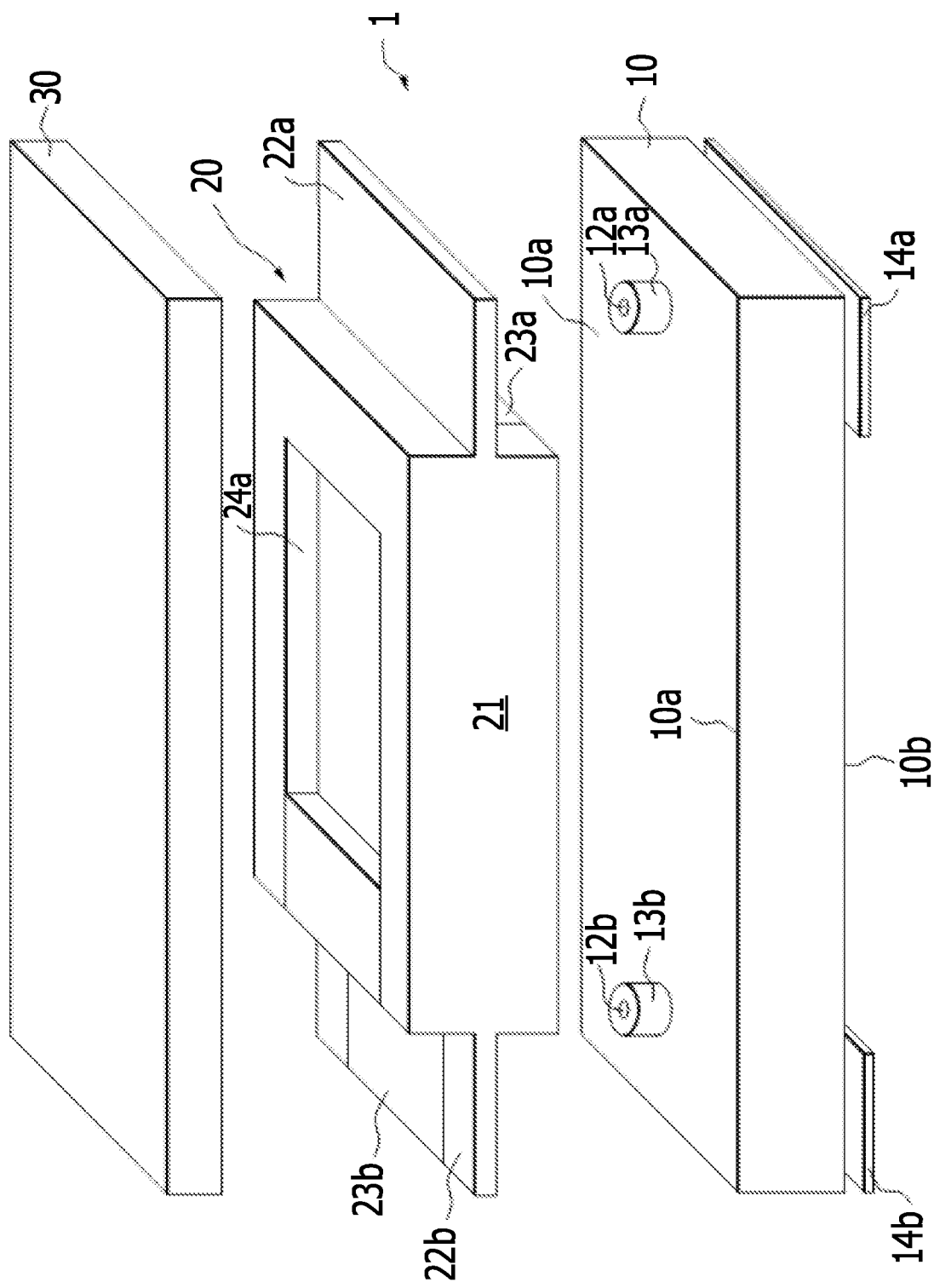

OSCILLATOR DEVICE AND METHOD OF MOUNTING OSCILLATOR DEVICE

CROSS-REFERENCE TO RELATED APPLICATION

This application is based upon and claims the benefit of priority of the prior Japanese Patent Application No. 2013-106291, filed on May 20, 2013, the entire contents of which are incorporated herein by reference.

FIELD

The embodiments discussed herein are related to an oscillator device and a method of mounting an oscillator device.

BACKGROUND

In the related art, an oscillator device in which an element such as a crystal oscillator is sealed has been used.

An element such as a crystal oscillator is used while being sealed by, for example, being sandwiched between two substrates in order to be protected. An oscillator device may be mounted on a printed wiring board by soldering or the like.

FIG. 1 is a diagram illustrating an oscillator device of the related art.

A oscillator device 101 includes a first substrate 110, a crystal oscillator 120 that is disposed on the first substrate 110, and a second substrate 130 that is disposed on the crystal oscillator 120. For example, a glass plate may be used as the material out of which the first substrate 110 and the second substrate 130 are formed.

The oscillator device 101 includes an outer electrode 114a that is connected to one of end portions of the crystal oscillator 120 and an outer electrode 114b that is connected to the other one of the end portions of the crystal oscillator 120. The crystal oscillator 120 oscillates as a result of power being supplied thereto through the outer electrodes 114a and 114b.

The outer electrode 114a is formed in such a manner as to extend from the one of the end portions of the crystal oscillator 120 to one of end portions of the first substrate 110. Similarly, the outer electrode 114b is formed in such a manner as to extend from the other one of the end portions of the crystal oscillator 120 to the other one of the end portions of the first substrate 110.

The outer electrode 114a is electrically connected to an electrode pad 141a of a printed wiring board 140 through a solder portion 143a. Similarly, the outer electrode 114b is electrically connected to an electrode pad 141b of the printed wiring board 140 through a solder portion 143b.

The oscillator device 101 is soldered on the printed wiring board 140 by, for example, reflow soldering.

Since the outer electrodes 114a and 114b are usually formed by using a thin-film forming method, it is difficult to form the outer electrodes 114a and 114b so as to have a large thickness.

Therefore, when the outer electrode 114a is soldered on the electrode pad 141a of the printed wiring board 140, a phenomenon that is so-called solder leaching in which a portion K of the outer electrode 114a that is connected to the one of the end portions of the crystal oscillator 120 is absorbed by the solder portion 143a may sometimes occur.

When solder leaching occurs, the electrical connection between the outer electrode 114a and the one of the end portions of the crystal oscillator 120 is disconnected, and thus, the crystal oscillator 120 on the printed wiring board 140 will not be driven.

Accordingly, there is a demand for an oscillator device in which disconnection between a crystal oscillator and a printed wiring board does not occur.

For example, a crystal oscillator and a printed wiring board may be electrically connected to each other by using a through electrode that extends through a first substrate.

However, in the case where a oscillator device that includes a through electrode that extends through a first substrate is soldered to a printed wiring board by reflow soldering, the through electrode that is thermally expanded due to the heat that is applied at the time of reflow soldering may break a through hole in which the through electrode is received.

The followings are reference documents:
[Document 1] Japanese Laid-open Patent Publication No. 09-213455,
[Document 2] Japanese Laid-open Patent Publication No. 11-176505,
[Document 3] Japanese Laid-open Patent Publication No. 2003-43065 and
[Document 4] Japanese Laid-open Patent Publication No. 62-291950.

SUMMARY

According to an aspect of the invention, a oscillator device includes: a first substrate that has a first surface, a second surface, and a through hole extending between the first surface and the second surface; a crystal oscillator that is disposed on the first surface of the first substrate, the crystal oscillator including an electrode; a second substrate that is disposed on the crystal oscillator; a through electrode that is disposed in the through hole, that has a diameter smaller than a diameter of the through hole, that is electrically coupled to the electrode, and that extends between the first surface and the second surface; and a filling member with which an area between an inner wall of the through hole and the through electrode is filled.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is an exploded perspective view of the oscillator device illustrated in FIGS. 2A and 2B;

DESCRIPTION OF EMBODIMENTS

A preferred embodiment of an oscillator device disclosed herein will be described below with reference to FIG. 2A to FIG. 6. However, the technical scope is not limited to the following embodiments and encompasses the contents described in the claims and equivalents thereof.

Figure 1:
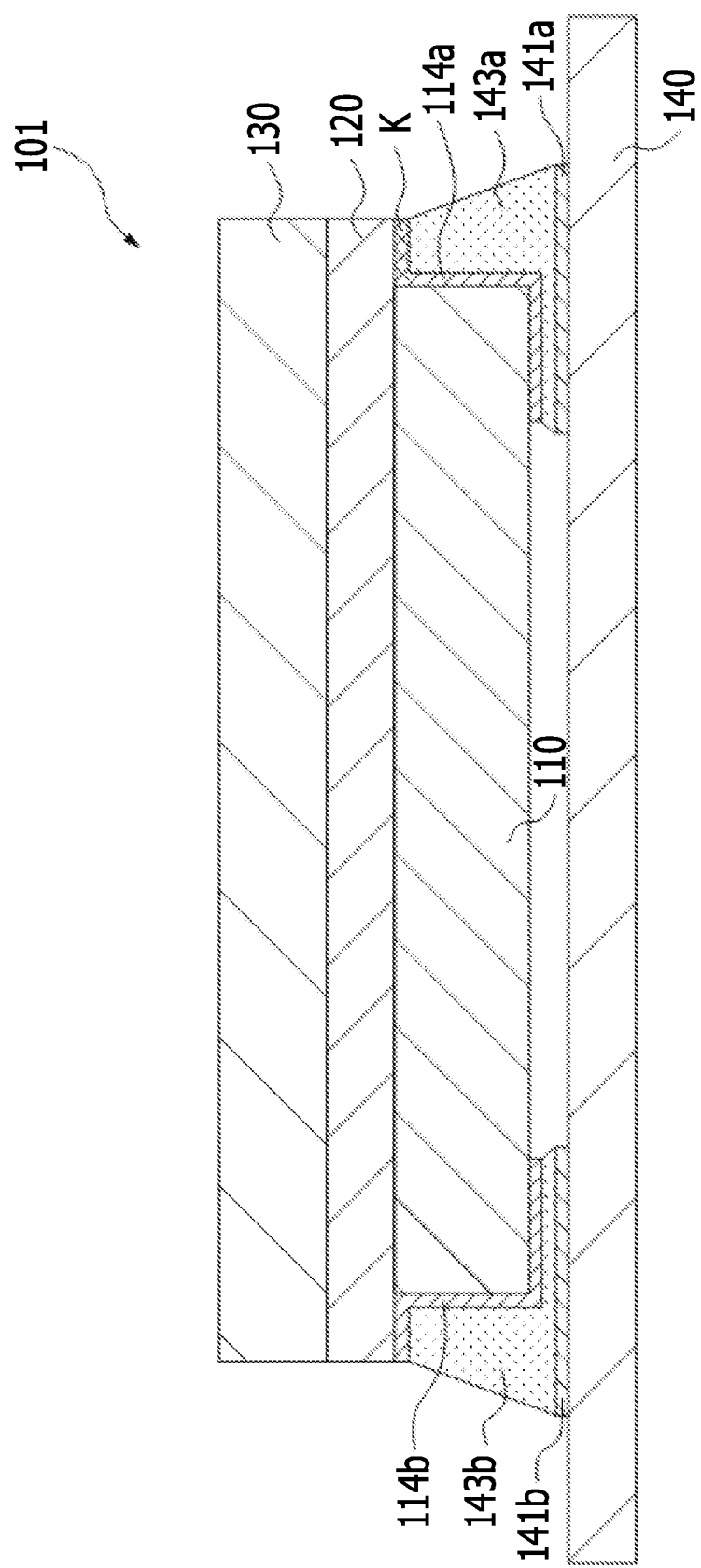
FIG. 1 is a diagram illustrating a oscillator device of the related art.
Figure 2A:
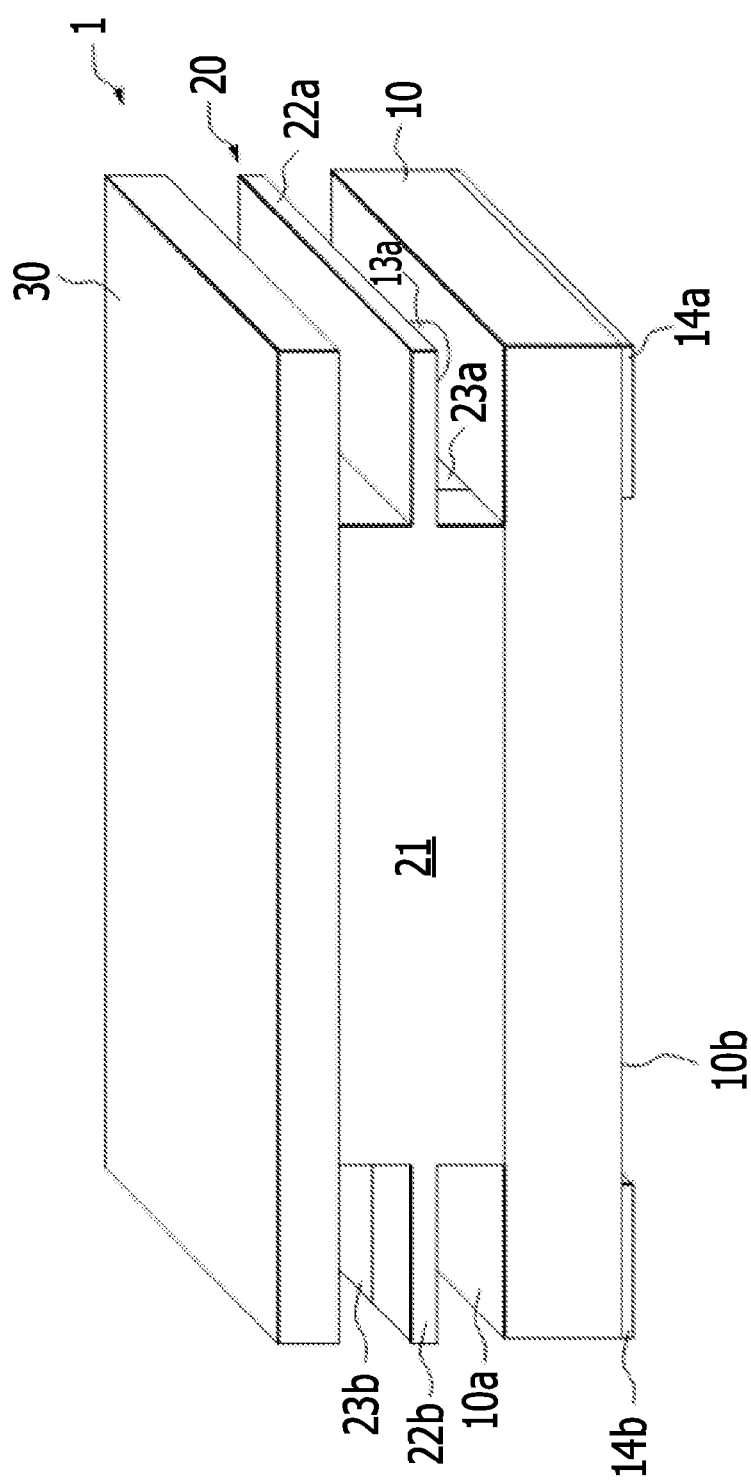
FIG. 2A is a perspective view of a oscillator device according to an embodiment disclosed herein.
Figure 2B:
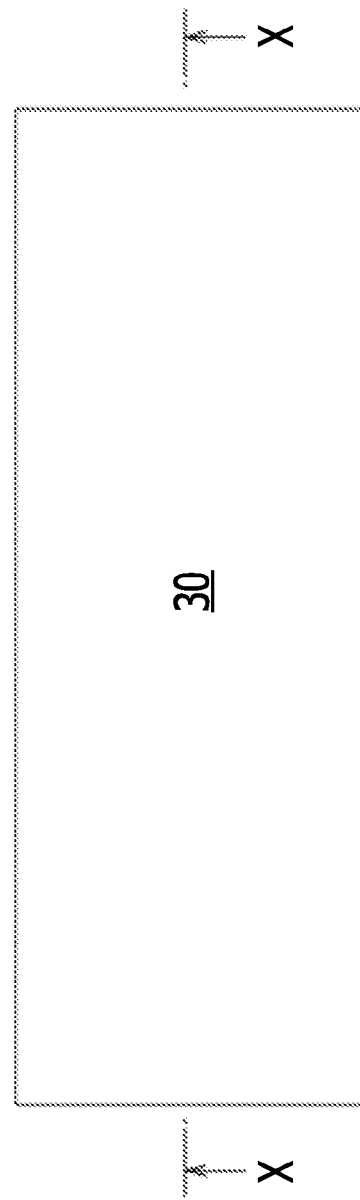
FIG. 2B is a plan view of the oscillator device.
Figure 4:
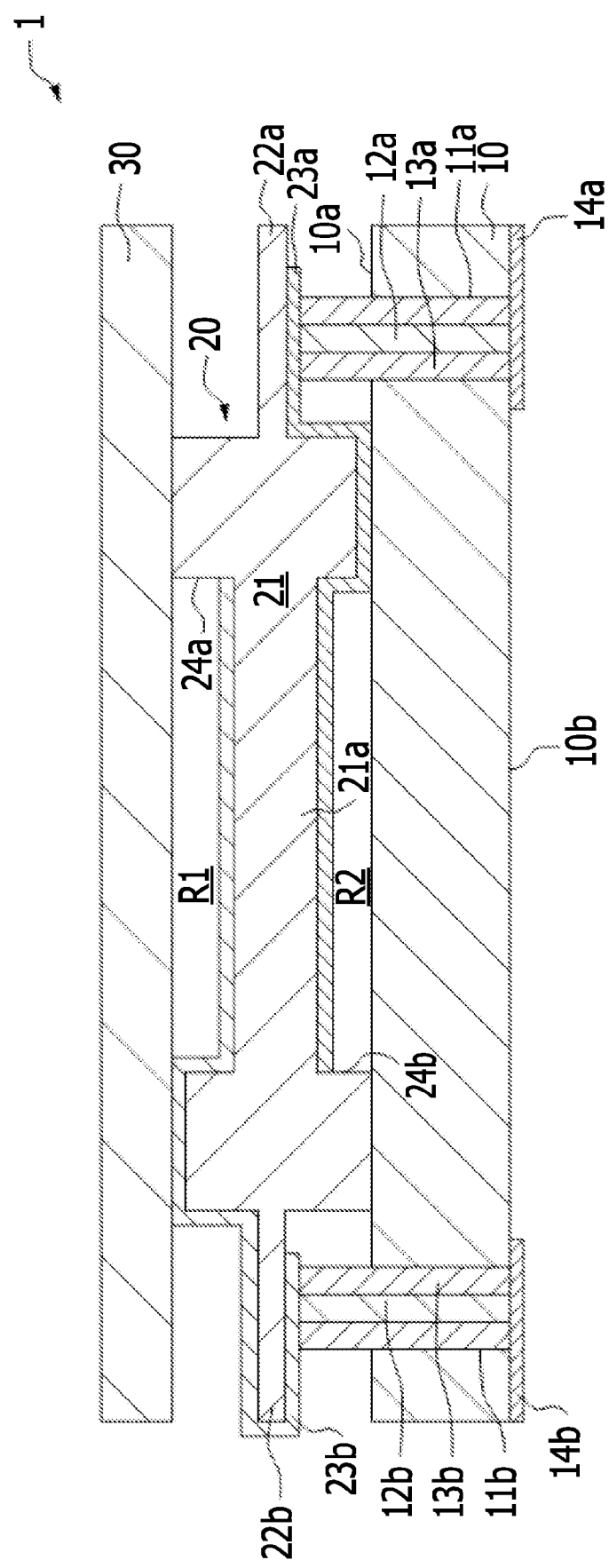
FIG. 4 is an end view taken along IV-IV of FIG. 2B.

FIG. 2A is a perspective view of an oscillator device according to an embodiment disclosed herein, and FIG. 2B is a plan view of the oscillator device. FIG. 3 is an exploded perspective view of the oscillator device illustrated in FIGS. 2A and 2B. FIG. 4 is an end view taken along IV-IV of FIG. 2B.

In an oscillator device 1 of the present embodiment, a crystal oscillator 20 is sealed by being sandwiched between a first substrate 10 and a second substrate 30. The first substrate 10 and the second substrate 30 may be made of, for example, silicate glass.

The crystal oscillator 20 includes a quartz crystal that is cut in such a manner as to have a predetermined natural frequency. The crystal oscillator 20 oscillates at a resonance frequency by being driven by an external circuit that includes a capacitor and the like.

The crystal oscillator 20 includes an element body 21 that oscillates as a result of a voltage being applied thereto and a pair of extending portions 22a and 22b that extend outward from the sides of the an element body 21.

Each of the extending portions 22a and 22b is formed in such a manner as to have a thickness that is smaller than that of the element body 21, and an external force causes elastic deformation of each of the extending portions 22a and 22b in a top-bottom direction.

The element body 21 has a recess 24a that is open toward the side of the second substrate 30 and a recess 24b that is open toward the side of the first substrate 10. A portion between the recess 24a and the recess 24b is an oscillating portion 21a that oscillates as a result of a voltage being applied thereto.

A drive electrode 23a that applies a voltage to the oscillating portion 21a is disposed in such a manner as to extend from the extending portion 22a onto a surface of the oscillating portion 21a on the side of the first substrate 10.

Similarly, a drive electrode 23b that applies a voltage to the oscillating portion 21a is disposed in such a manner as to extend from a surface of the extending portion 22b on the side of the first substrate 10 to a surface of the oscillating portion 21a on the side of the second substrate 30.

The pair of drive electrodes 23a and 23b apply a voltage to the two surfaces of the oscillating portion 21a in such a manner as to cause the oscillating portion 21a to oscillate.

The second substrate 30 is disposed over the recess 24a, and an enclosed space R1 is defined by the recess 24a and the second substrate 30. Similarly, the first substrate 10 is disposed below the recess 24b, and an enclosed space R2 is defined by the recess 24b and the first substrate 10.

In the case where dust and the like are deposited in the recesses 24a and 24b, the dust and the like may sometimes affect the natural frequency, and thus, the enclosed spaces R1 and R2 are defined on the sides of the oscillating portion 21a.

The first substrate 10 has a first surface 10a and a second surface 10b and has two through holes 11a and 11b that extend between the first surface 10a and the second surface 10b. The above-described crystal oscillator 20 is disposed on the first surface 10a of the first substrate 10.

A through electrode 12a that has a diameter smaller than that of the through hole 11a and a through electrode 12b that has a diameter smaller than that of the through hole 11b are disposed in the through holes 11a and 11b, respectively, in such a manner as to be electrically connected to the drive electrodes 23a and 23b of the crystal oscillator 20, respectively, and to extend between the first surface 10a and the second surface 10b. The through electrodes 12a and 12b are made of, for example, copper, aluminum, or the like.

Each of the through electrodes 12a and 12b of the present embodiment has a vertically elongated columnar shape. A portion of each of the through electrodes 12a and 12b on the side of the first surface 10a projects from the first substrate 10.

An end surface of the through electrode 12a on the side of the first surface 10a is joined to the drive electrode 23a. Similarly, an end surface of the through electrode 12b on the side of the first surface 10a is joined to the drive electrode 23b.

The positions of end surfaces of the through electrodes 12a and 12b on the side of the second surface 10b are at the same level as that of the second surface 10b. The end surface of the through electrode 12a on the side of the second surface 10b is joined to an outer electrode 14a. Similarly, the end surface of the through electrode 12b on the side of the second surface 10b is joined to an outer electrode 14b.

The voltage that is applied to the outer electrode 14a from the outside is supplied to the drive electrode 23a of the crystal oscillator 20 via the through electrode 12a. Similarly, the voltage that is applied to the outer electrode 14b from the outside is supplied to the drive electrode 23b of the crystal oscillator 20 via the through electrode 12b. The outer electrodes 14a and 14b may be formed of, for example, a copper sheet on top of which nickel or gold is stacked.

The outer electrodes 14a and 14b of the oscillator device 1 are, for example, joined to a printed wiring board and supplied with power from the printed wiring board (described in detail later). The outer electrodes 14a and 14b are soldered to the printed wiring board by reflow soldering or the like, so that the oscillator device 1 may be joined to the printed wiring board.

When the oscillator device 1 is heated by reflow soldering, the through electrodes 12a and 12b thermally expand and extend in a width direction or a longitudinal direction. Here, the width direction is a direction perpendicular to the longitudinal direction of the through electrodes 12a and 12b.

In the case where the through electrodes 12a and 12b are made of copper, the coefficient of linear expansion of each of the through electrodes 12a and 12b is about 16.6E-6 (1/K). In the case where the through electrodes 12a and 12b are made of aluminum, the coefficient of linear expansion of each of the through electrodes 12a and 12b is about 14.3E-6 (1/K).

In the case where there is no gap between the through electrode 12a and the inner wall of the through hole 11a and between the through electrode 12b and the inner wall of the through hole 11b, the through holes 11a and 11b and the first substrate 10 may break due to the through electrodes 12a and 12b that thermally expand by being heated.

Accordingly, the oscillator device 1 includes filling members 13a and 13b with which the area between the inner wall of the through hole 11a and the through electrode 12a and the area between the inner wall of the through hole 11b and the through electrode 12b are filled, respectively. The filling members 13a and 13b absorb deformation of the through electrodes 12a and 12b as a result of thermal expansion by deforming and reduce the possibility of the deformation of the through electrodes 12a and 12b as a result of thermal expansion being transmitted to the through holes 11a and 11b and the first substrate 10.

Each of the filling members 13a and 13b are formed of members that are capable of being deformed as a result of receiving an external force and that are arranged in such a manner as to have a gap therebetween. The through holes 11a and 11b are respectively filled with the filling members 13a and 13b that are arranged in such a manner that the through electrodes 12a and 12b are covered by the filling members 13a and 13b, respectively. When the filling members 13a and 13b are pressed by the through electrodes 12a and 12b that have thermally expanded the members out of which the filling members 13a and 13b are formed become deformed and the gaps between the members are reduced.

Specific examples of the material out of which the deformable members, which form the filling members 13a and 13b, are made are carbon nanotubes, steel wool, silicone rubber, and the like.

The filling members 13a and 13b may be formed as, for example, an aggregate of carbon nanotube fibers or carbon nanotube sheets that are arranged in such a manner that the fibers or sheets have gaps therebetween.

It is preferable that the filling members 13a and 13b be capable of absorbing deformation of the through electrodes 12a and 12b as a result of thermal expansion and have rigidity enough to support the positions of the through electrodes 12a and 12b in the through holes 11a and 11b. This is because, in a process of manufacturing the oscillator device 1, the filling members 13a and 13b support the through electrodes 12a and 12b in the through holes 11a and 11b before the through electrodes 12a and 12b are joined to the drive electrodes 23a and 23b or the outer electrodes 14a and 14b, respectively.

In the oscillator device 1, the filling members 13a and 13b are arranged in such a manner that the entire through electrodes 12a and 12b are covered by the filling members 13a and 13b in the longitudinal direction, respectively.

Although the filling members 13a and 13b do not have to have electrical conductivity, from the standpoint of improving the conductivity in the through holes 11a and 11b, it is preferable that the filling members 13a and 13b have electrical conductivity.

Figure 5A:
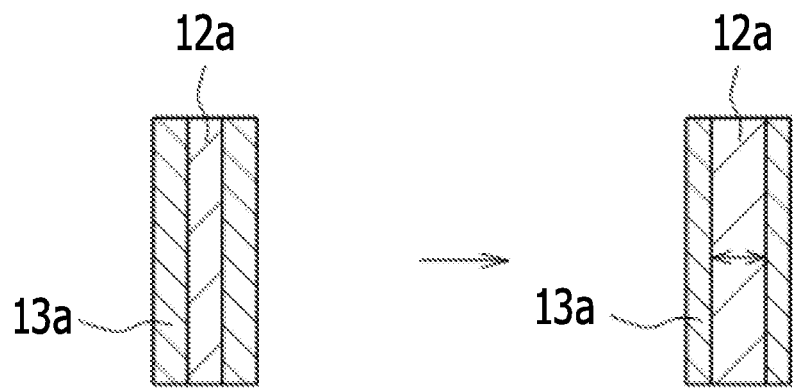
FIGS. 5A and 5B are diagrams describing a function of a filling member when a through electrode thermally expands in a width direction.
Figure 5B:
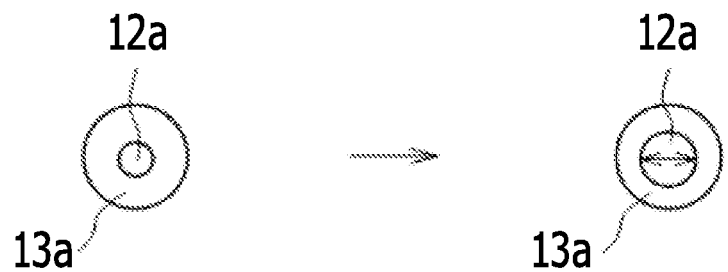

FIGS. 5A and 5B are diagrams describing a function of the filling member when the through electrode thermally expands in the width direction. FIG. 5A illustrates the state of the through electrode in a longitudinal sectional view, and FIG. 5B illustrates the state of the through electrode when viewed from the top surface.

When the through electrode 12a is heated, the through electrode 12a expands in the width direction. The filling member 13a with which the area between the through electrode 12a and the through hole 11a is filled shrinks by an amount equal to the amount of expansion of the through electrode 12a in the width direction. As a result, a possibility of a force that would cause deformation or breakage of the through hole 11a being transmitted to the inner wall of the through hole 11a may be reduced. The above description of the filling member 13a may also be applied to the filling member 13b.

As described above, the filling members 13a and 13b are mainly used for absorbing deformation of the through electrodes 12a and 12b as a result of thermal expansion in the width direction.

When the through electrodes 12a and 12b are heated, the through electrodes 12a and 12b also thermally expand in the longitudinal direction.

Thus, in the oscillator device 1, the crystal oscillator 20 is capable of being deformed in such a manner as to follow deformation of the through electrodes 12a and 12b as a result of thermal expansion of the through electrodes 12a and 12b that the crystal oscillator 20 receives via drive electrodes 23a and 23b.

Figure 6:
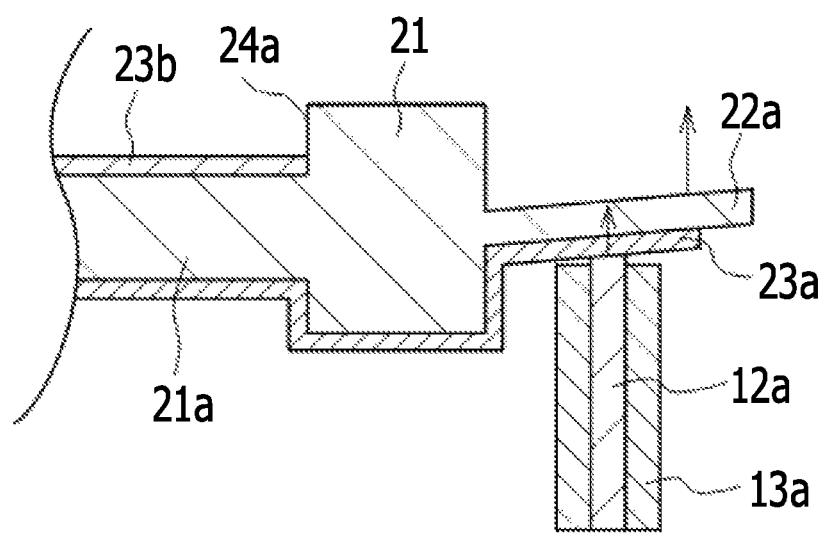
FIG. 6 is a diagram illustrating deformation of a crystal oscillator when the through electrode thermally expands in a longitudinal direction.

FIG. 6 is a diagram illustrating deformation of the crystal oscillator when the through electrode thermally expands in the longitudinal direction.

Since the end surface of the through electrode 12a on the side of the second surface 10b is joined to the outer electrode 14a, it is substantially difficult for the through electrode 12a to extend toward the side of the second surface 10b. On the other hand, since elastic deformation occurs in the extending portion 22a in the top-bottom direction, the through electrode 12a may extend toward the side of the extending portion 22a. Therefore, when the through electrode 12a is heated, the end surface thereof on the side of the second surface 10a that is joined to the drive electrode 23a extends in such a manner as to push up the extending portion 22a. The extending portion 22a that receives an external force applied by the through electrode 12a from below is deformed upward. As a result, the possibility of the crystal oscillator 20 breaking due to deformation of the through electrode 12a as a result of thermal expansion may be reduced.

A decrease in the temperature of the through electrode 12a as a result of finishing heating the through electrode 12a causes heat shrinkage of the through electrode 12a, and the length of the through electrode 12a in the longitudinal direction returns to the length of the through electrode 12a before the through electrode 12a thermally expanded. The extending portion 22a in which elastic deformation has occurred returns to its original state with the shrinkage of the through electrode 12a. The above description of the extending portion 22a may also be applied to the extending portion 22b.

The first substrate 10 has a rectangular shape in plain view, and the dimensions thereof may be, for example, 3.2 mm×1.5 mm. The shape of the first substrate 10 when viewed in plan is the same as those of the crystal oscillator 20 and the second substrate 30.

Each of the through holes 11a and 11b has a circular shape in plain view, and the diameter thereof may be, for example, 0.3 mm to 0.5 mm. The diameter of each of the through electrodes 12a and 12b may be, for example, 0.1 mm to 0.3 mm.

A preferred embodiment of a method of joining the above-described oscillator device to a printed wiring board will now be described below with reference to FIG. 7 to FIG. 11.

Figure 7:
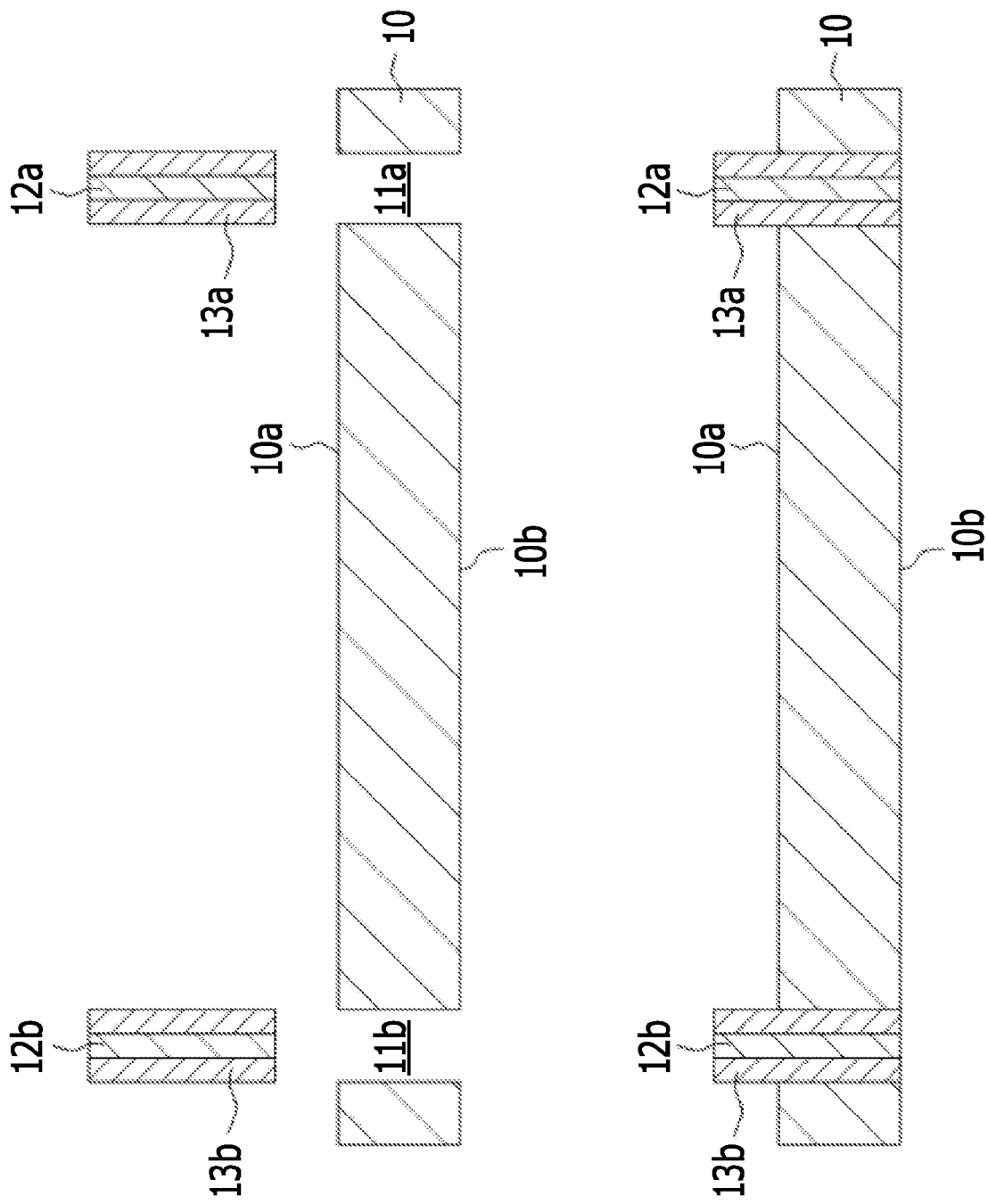
FIG. 7 is a first diagram illustrating a process of a method of joining the oscillator device disclosed herein to a substrate according to an embodiment.

First, as illustrated in FIG. 7, the through electrode 12a that is covered by the filling member 13a is inserted into the through hole 11a of the first substrate 10. The through electrode 12b that is covered by the filling member 13b is inserted into the through hole 11b. The through electrodes 12a and 12b are inserted into the through holes 11a and 11b, respectively, in such a manner that a portion of each of the through electrodes 12a and 12b on the side of the first surface 10a project from the first substrate 10.

Figure 8:
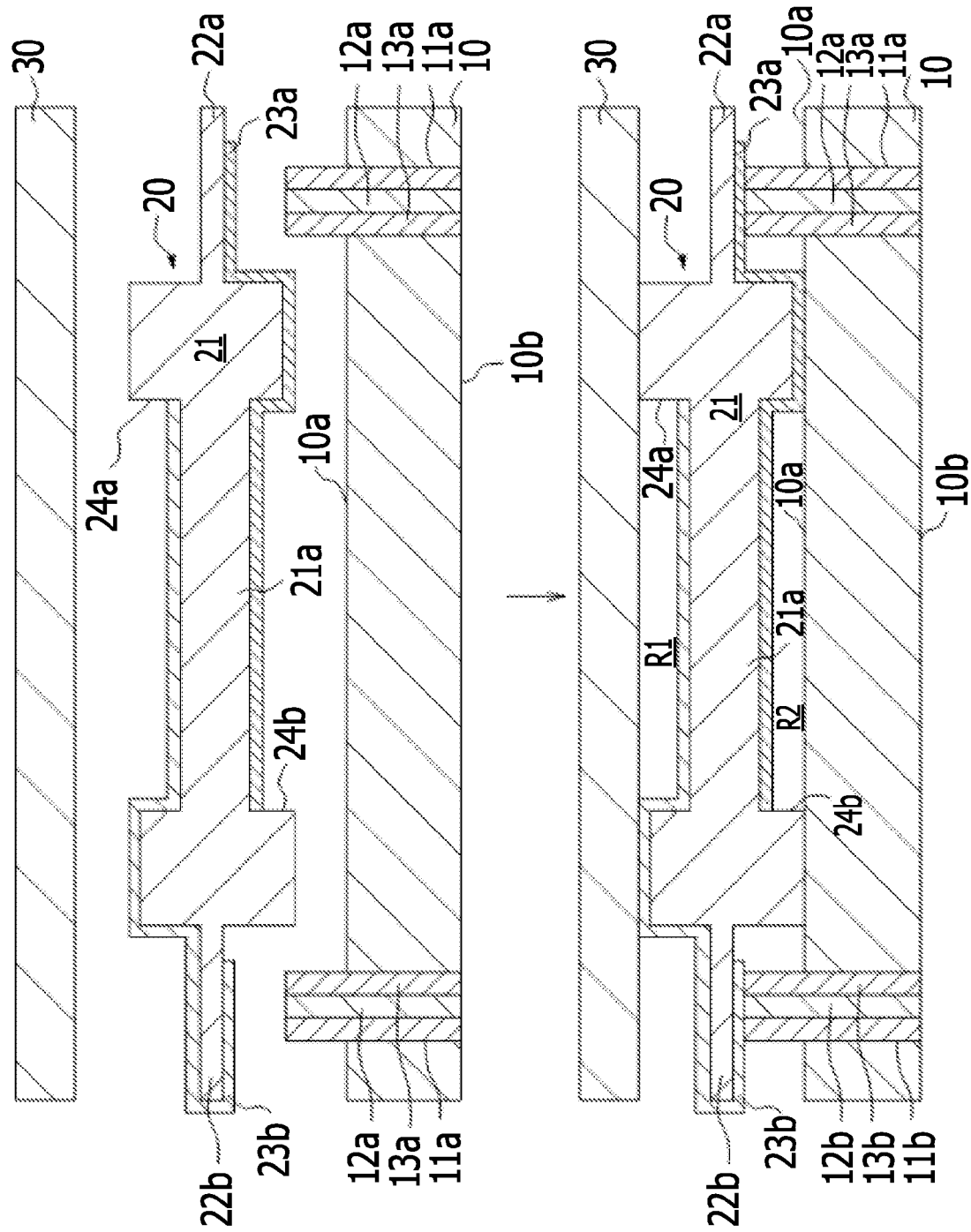
FIG. 8 is a second diagram illustrating a process of the method of joining the oscillator device disclosed herein to a substrate according to the embodiment.

Next, as illustrated in FIG. 8, the crystal oscillator 20 is disposed on the first substrate 10. In addition, the second substrate 30 is disposed on the crystal oscillator 20. The through electrodes 12a and 12b and the drive electrodes 23a and 23b are joined to each other, respectively, by using, for example, an atomic diffusion bonding method or an anodic bonding method. In addition, the element body 21 of the crystal oscillator 20, the first substrate 10, and the second substrate 30 are joined to one another by using, for example, an anodic bonding method, so that the enclosed spaces R1 and R2 are defined.

Figure 9:
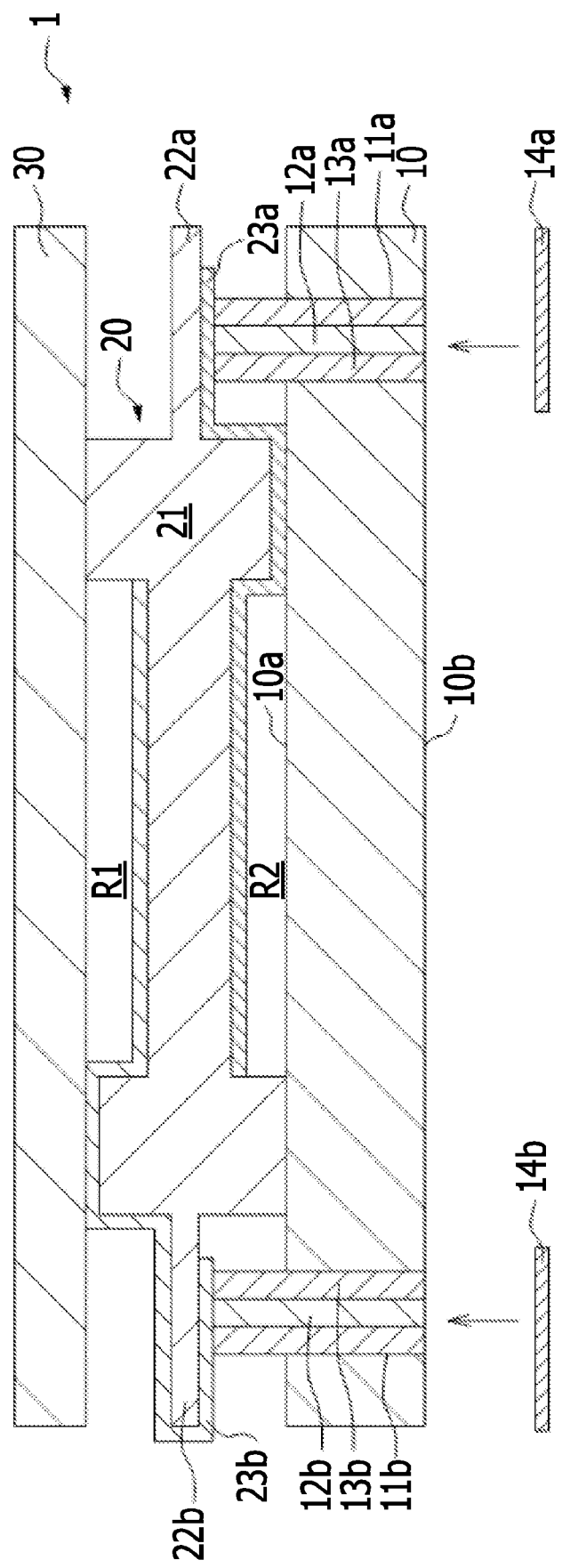
FIG. 9 is a third diagram illustrating a process of the method of joining the oscillator device disclosed herein to a substrate according to the embodiment.

Next, as illustrated in FIG. 9, the outer electrodes 14a and 14b are joined to the end surface of the through electrode 12a on the side of the second surface 10b and the end surface of the through electrode 12b on the side of the second surface 10b, respectively, by using an anodic bonding method or the like, so that the oscillator device 1 may be obtained. The outer electrodes 14a and 14b may also be joined to the second surface 10b of the first substrate 10.

Figure 10:
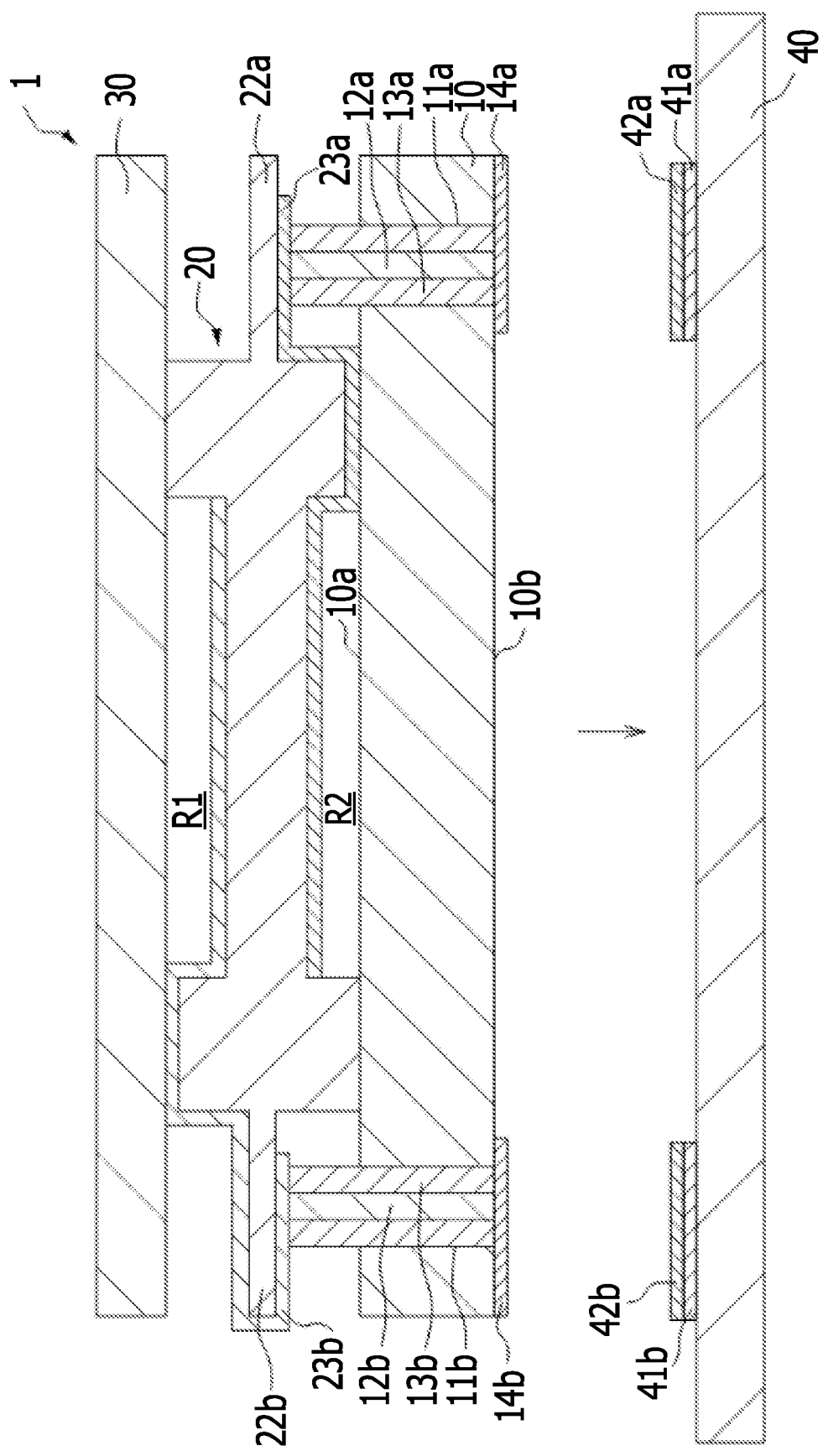
FIG. 10 is a fourth diagram illustrating a process of the method of joining the oscillator device disclosed herein to a substrate according to the embodiment.

Next, as illustrated in FIG. 10, a printed wiring board 40 in which solder paste portions 42a and 42b are applied on an electrode pads 41a and 41b, respectively, is prepared. Then, the oscillator device 1 is disposed on the printed wiring board 40 in such a manner that the second surface 10b of the first substrate 10 faces the printed wiring board 40. The outer electrode 14a is disposed on the electrode pad 41a with the solder paste portion 42a interposed therebetween, and the outer electrode 14b is disposed on the electrode pad 41b with the solder paste portion 42b interposed therebetween.

Figure 11:
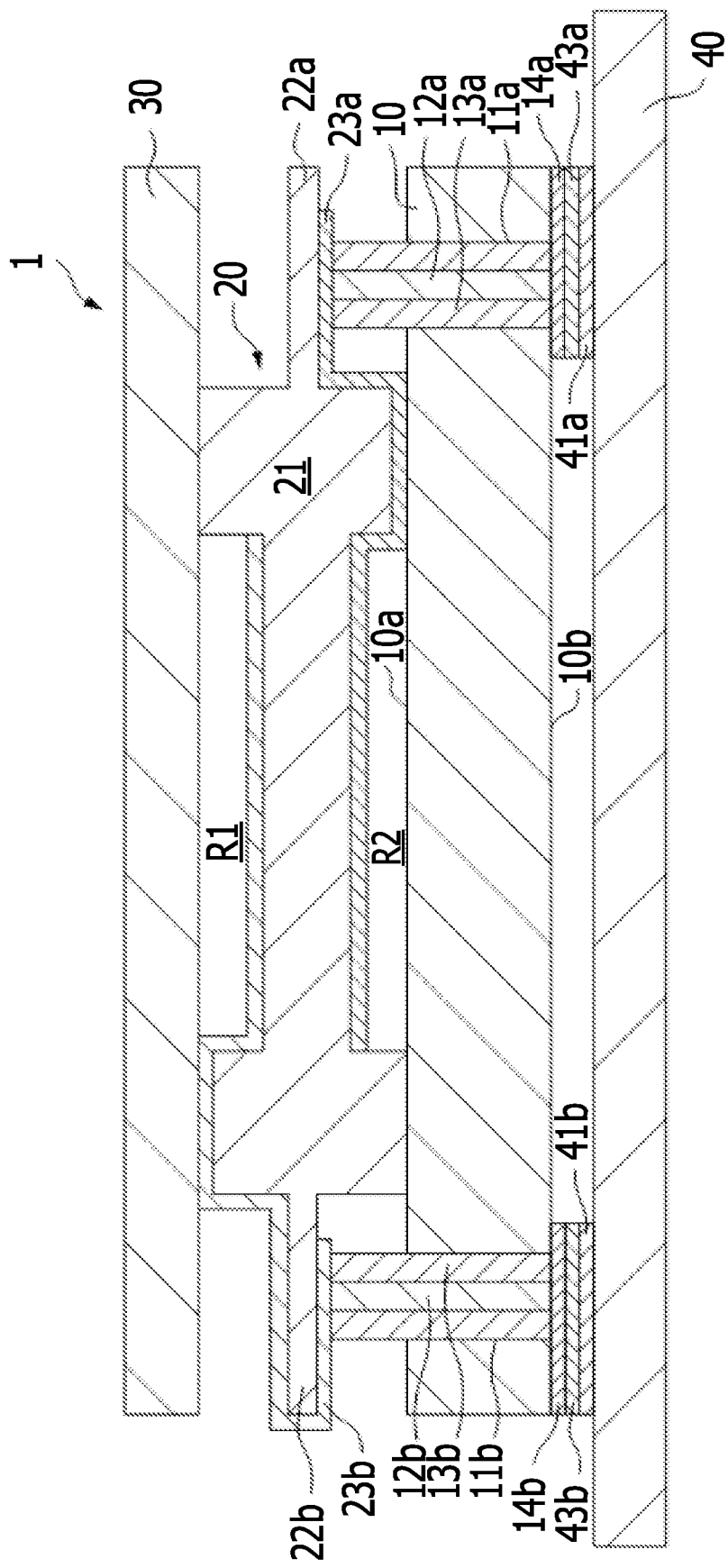
FIG. 11 is a fifth diagram illustrating a process of the method of joining the oscillator device disclosed herein to a substrate according to the embodiment.

Next, as illustrated in FIG. 11, the solder paste portions 42a and 42b are heated by reflow soldering. The outer electrode 14a and the electrode pad 41a are joined to each other via a molten solder portion 43a, and the outer electrode 14b and the electrode pad 41b are joined to each other via a molten solder portion 43b.

In this case, even if the through electrodes 12a and 12b thermally expand in the width direction as a result of heating the entire the oscillator device 1, elastic deformation occurs in the filling members 13a and 13b, so that the possibility of the through holes 11a and 11b and the first substrate 10 breaking may be reduced. In addition, even if the through electrodes 12a and 12b thermally expand in the longitudinal direction, elastic deformation occurs in the extending portions 22a and 22b, so that the possibility of the crystal oscillator 20 breaking may be reduced.

Suitable modifications may be made to the oscillator device and the method of joining an oscillator device to a substrate according to the above-described embodiments within the scope of the present disclosure.

For example, although the first substrate 10 is made of silicate glass in the above-described embodiments, the first substrate 10 may be made of a silicon substrate. In addition, although the crystal oscillator 20 is disposed on the first substrate 10 in the above-described embodiments, a MEMS element may be disposed on the first substrate 10.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An oscillator device comprising:
a first substrate that has a first surface, a second surface, a first through hole extending between the first surface and the second surface, and a second through hole extending between the first surface and the second surface;
a crystal oscillator that is disposed on the first surface of the first substrate, the crystal oscillator including
an element body;
a first extending portion that extends outward from a side of the element body;
a second extending portion that extends outward from another side of element body:
a first recess formed in a first surface of the element body facing the first substrate;
a second recess formed in a second surface of the element body that is on an opposite side of the first surface;
a first electrode formed on an inner surface of the first recess and on a surface of the first extending portion: and
a second electrode formed on an inner surface of the second recess and on a surface of the second extending portion,
wherein the first substrate includes
a first through electrode disposed in the first through hole and protruding from the first surface of the first substrate, that is electrically coupled to the first electrode,
a second through electrode disposed in the second through hole and protruding from the first surface of the first substrate, that is electrically coupled to the second electrode,
a first filling member between an inner wall of the first through hole and the first through electrode and
a second filling member filled between an inner wall of the second through hole and the second through electrode.
2. The oscillator device according to claim 1, wherein the element body oscillates as a result of a voltage being applied thereto.
3. The oscillator device according to claim 2, wherein a thickness of the first extending portion and a thickness of the second extending portion are smaller than a thickness of the body.
4. The oscillator device according to claim 1, wherein the first substrate is made of silicate glass.
5. A method of mounting an oscillator device comprising:
manufacturing an oscillator device by
forming a first through hole and a second through hole in a first substrate in such a manner that the first and second through holes extend between a first surface and a second surface,
embedding a through electrode and a second through electrode that are covered by a member capable of being deformed as a result of receiving an external force in the first and second through holes in such a manner that the first and second through electrodes project from the second surface of the first substrate,
disposing a crystal oscillator on the first substrate, the crystal oscillator includes element body, a first extending portion that extends outward from a side of the element body, a second extending portion that extends outward from another side of the element body, a first recess formed in a first surface of the element body facing the first substrate, a second recess formed in a second surface of the element body that is an opposite side of the first surface, a first electrode formed on an inner surface of the first recess and on a surface of the first extending portion, and a second electrode formed on an inner surface of the second recess and on a surface of the second extending portion,
joining the first substrate and the crystal oscillator to each other in such a manner that the first and second through electrodes and the first and second electrodes are electrically coupled to each other, joining a second substrate to the crystal oscillator, and
joining outer electrodes to the first and second through electrodes that are exposed at the second surface of the first substrate;
applying solder paste onto electrode pads of a third substrate;
arranging a semiconductor unit over the third substrate in such a manner that the outer electrodes of the oscillator device are brought into contact with the solder paste on the electrode pads; and
joining the semiconductor unit to the third substrate by reflow soldering.

* * * * *